(12) United States Patent
Kim et al.

(10) Patent No.: US 9,297,069 B2
(45) Date of Patent: Mar. 29, 2016

(54) CONDUCTIVE FILM SUBSTRATE, PHOTOVOLTAIC CELL HAVING THE SAME, AND METHOD OF MANUFACTURING THE SAME

(71) Applicant: Samsung Corning Precision Materials Co., Ltd., Gyeongsangbuk-do (KR)

(72) Inventors: SeoHyun Kim, ChungCheongNam-Do (KR); GunSang Yoon, ChungCheongNam-Do (KR); Hyunhee Lee, ChungCheongNam-Do (KR); YoungZo Yoo, ChungCheongNam-Do (KR)

(73) Assignee: Corning Precision Materials Co., Ltd. (KR)

( * ) Notice: Subject to any disclaimer, the term of this patent is extended or adjusted under 35 U.S.C. 154(b) by 165 days.

(21) Appl. No.: 13/771,582

(22) Filed: Feb. 20, 2013

(65) Prior Publication Data

US 2013/0213464 A1 Aug. 22, 2013

(30) Foreign Application Priority Data

Feb. 21, 2012 (KR) ........................ 10-2012-0017481

(51) Int. Cl.
| | | |
|---|---|---|
| *C23C 16/40* | (2006.01) | |
| *B32B 3/26* | (2006.01) | |
| *H01L 31/0224* | (2006.01) | |
| *H01L 31/0236* | (2006.01) | |
| *H01L 31/18* | (2006.01) | |
| *H01L 21/02* | (2006.01) | |

(52) U.S. Cl.
CPC ............... *C23C 16/407* (2013.01); *B32B 3/263* (2013.01); *H01L 31/02366* (2013.01); *H01L 31/022483* (2013.01); *H01L 31/1884* (2013.01); *H01L 21/0262* (2013.01); *H01L 21/02554* (2013.01); *H01L 21/02573* (2013.01); *Y02E 10/50* (2013.01); *Y10T 428/24355* (2015.01)

(58) Field of Classification Search
None
See application file for complete search history.

(56) References Cited

U.S. PATENT DOCUMENTS

| 2005/0000564 A1* | 1/2005 | Sato et al. ...................... 136/256 |
| 2007/0172591 A1* | 7/2007 | Seo et al. .................... 427/248.1 |
| 2010/0126575 A1* | 5/2010 | Bailat et al. .................... 136/256 |

FOREIGN PATENT DOCUMENTS

| KR | 20090084539 A | 8/2009 |
| WO | WO2007113037 | * 10/2007 |

OTHER PUBLICATIONS

Hu Solar Cells 12-294936 NPL 1991 V30 p. 437-450.*

* cited by examiner

*Primary Examiner* — Joseph Miller, Jr.
(74) *Attorney, Agent, or Firm* — Lerner, David, Littenberg, Krumholz & Mentlik, LLP

(57) ABSTRACT

A conductive film substrate, a photovoltaic cell having the same, and a method of manufacturing the same. The conductive film substrate includes a base substrate and a transparent conductive film formed on the base substrate. The transparent conductive film is a zinc oxide thin film which has first texture structures and second texture structures concurrently formed on a surface thereof. The second texture structures are smaller than the first texture structures.

11 Claims, 15 Drawing Sheets (a)  (b)

(a)  (b)

CONDUCTIVE FILM SUBSTRATE, PHOTOVOLTAIC CELL HAVING THE SAME, AND METHOD OF MANUFACTURING THE SAME

CROSS REFERENCE TO RELATED APPLICATION

The present application claims priority from Korean Patent Application Number 10-2012-0017481 filed on Feb. 21, 2012, the entire contents of which application are incorporated herein for all purposes by this reference.

BACKGROUND OF THE INVENTION

1. Field of the Invention

The present invention relates to a conductive film substrate, a photovoltaic cell having the same, and a method of manufacturing the same, and more particularly, to a conductive film substrate which includes a transparent conductive film made of zinc oxide (ZnO), a photovoltaic cell having the same, and a method of manufacturing the same.

2. Description of Related Art

Photovoltaic cells are a key device for photovoltaic power generation that directly converts solar energy into electrical energy. At present, photovoltaic cells are being applied in a variety of fields, including the supply of electricity to electrical and electronic products, houses and buildings as well as industrial power generation. The most basic structure of photovoltaic cells is a p-n junction diode. Photovoltaic cells are divided into a variety of types, for example, a silicon (Si) photovoltaic cell which uses Si for a light-absorbing layer, a chemical photovoltaic cell which uses $CuInSe_2$ (CIS) or cadmium telluride (CdTe) for the light-absorbing layer, a dye-sensitized photovoltaic cell in which photosensitive dye molecules are adsorbed on the surface of nano particles of a porous film such that electrons are activated when the photosensitive dye molecules absorb visible light, and a tandem photovoltaic cell which has a plurality of amorphous Si layers stacked on one another, depending on the material used in the light-absorbing layer. In addition, photovoltaic cells are also divided into bulk type photovoltaic cells (including single crystalline and polycrystalline types) and thin film type photovoltaic cells (including amorphous and polycrystalline types)

The tandem photovoltaic cell has advantages in that it can increase its open voltage and improve a conversion efficiency of incident light.

FIG. 1 is a schematic cross-sectional view showing the structure of a tandem thin-film photovoltaic cell of the related art.

As shown in FIG. 2, the tandem thin-film photovoltaic cell 110 of the related art generally includes a substrate 111, a transparent conductive film 112, a first p-n junction layer 113, a tunneling p-n junction layer 114, a second p-n junction layer 115 and a back reflector 116. The first p-n junction layer 113 having a predetermined band gap (e.g. Eg=1.9 eV) is disposed on the second p-n junction layer 115 having a smaller band gap (e.g. Eg=1.42 eV), such that the first p-n junction layer 113 absorbs photons, the energy of which is greater than 1.9 eV, and the second p-n junction layer 115 absorbs photons, the energy of which is in the range 1.42 eV<hv<1.9 eV.

Here, the light transmittance, conductivity and light scattering effect of the transparent conductive film 112 are required to be high. In particular, since the light absorptivity of amorphous silicon is low, the surface of the transparent conductive film is textured in order to increase the power generation efficiency of the photovoltaic cell by increasing the path of incident light through light scattering (light trapping effect).

The transparent conductive film of the photovoltaic cell is manufactured using tin oxide ($SnO_2$) or zinc oxide (ZnO). However, the tin oxide is reduced by hydrogen plasma created during a plasma-enhanced chemical vapor deposition (PECVD) process, which is intended for the manufacture of the light-absorbing layer of the thin-film photovoltaic cell, thereby decreasing the transmittance of the transparent conductive film, which is problematic. Although the amorphous silicon has an optical response range from 400 nm to 800 nm, the silicon tandem photovoltaic cell has an optical response range from 400 nm to 1100 nm. Therefore, various researches are being carried out on the transparent conductive film using zinc oxide since the light transmittance of zinc oxide in the near infrared (NIR) range is superior to the light transmittance of tin oxide.

In order to improve the power generation efficiency of the photovoltaic cell, a short circuit current, an open circuit voltage and a fill factor are required to be high. In addition, low-resistance characteristics are required for the transparent conductive film in order to reduce the series resistance of the photovoltaic cell. In particular, the transparent conductive film is required to have high charge mobility.

However, the transparent conductive film of the related art has drawbacks in that its charge mobility and low-resistance characteristics are unsatisfactory.

The information disclosed in the Background of the Invention section is only for the enhancement of understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a conductive film substrate which has improved charge mobility and low-resistance characteristics, a photovoltaic cell having the same, and a method of manufacturing the same.

In an aspect of the present invention, provided is a conductive film substrate that includes a base substrate; and a transparent conductive film formed on the base substrate. The transparent conductive film is a zinc oxide thin film which has first texture structures and second texture structures concurrently formed on a surface thereof. The second texture structures are smaller than the first texture structures.

In an exemplary embodiment, the distribution density of the first texture structures may range from $2/\mu m^2$ to $20/\mu m^2$ and a distribution density of the second texture structures may range from $50/\mu m^2$ to $500/\mu m^2$ The first texture structures may have a length ratio of a short axis to a long axis ranging from 0.15 to 0.70 when viewed perpendicularly from above the base substrate. It is preferred that the length of each long axis of the first texture structures may range from 200 nm to 500 nm and the length of each short axis of the first texture structures may range from 80 nm to 200 nm when viewed perpendicularly from above the base substrate.

The first texture structures may have a hexagonal shape when viewed perpendicularly from above the base substrate.

The length of each axis of the second texture structures may range from 30 nm to 150 nm when viewed perpendicularly from above the base substrate.

The transparent conductive film may contain at least one sort of dopant selected from the group consisting of Al, Ga, B, In and F. It is preferred that the dopant be added in an amount of 7 wt % or less of a content of zinc oxide.

In another aspect of the present invention, provided is a photovoltaic cell having the above-described conductive film substrate.

In a further aspect of the present invention, provided is a method of manufacturing the above-described conductive film substrate. The method includes the following steps of: preparing the base substrate; and forming the transparent conductive film on the base substrate.

The transparent conductive film may be formed by one process selected from the group consisting of atmospheric pressure chemical vapor deposition (APCVD), low pressure chemical vapor deposition (LPCVD) and sputtering.

The transparent conductive film may be formed by the APCVD. The APCVD includes the steps of: loading the base substrate into a chamber; heating the loaded base substrate; and feeding a zinc precursor and an oxidizer gas into the chamber, a molar ratio of the zinc precursor to the oxidizer gas ranging from 1:12 to 1:28.

The step of feeding the zinc precursor and the oxidizer gas may include feeding the zinc precursor at a rate ranging from 0.001552 mol/min to 0.002328 mol/min and the oxidizer gas at a rate ranging from 0.5 g/min to 1 g/min.

The zinc precursor may contain one selected from the group consisting of diethylzinc, dimethylzinc and a mixture thereof.

The oxidizer gas may contain at least one substance selected from the group consisting of $H_2O$, ethanol, methanol, butanol, propanol and isopropanol.

The step of heating the loaded base substrate may include heating the loaded base substrate in a temperature ranging from 350° C. to 550° C.

The step of feeding the zinc precursor and the oxidizer gas may include additionally feeding at least one sort of dopant selected from the group consisting of Al, Ga, B, In and F.

It is preferred that the dopant be added in an amount of 7 wt % or less of a content of zinc oxide.

According to embodiments of the invention as set forth above, high charge mobility and excellent low-resistance characteristics are achieved since the first texture structures and the second texture structures, the second texture structures being smaller than the first texture structures, are concurrently formed on the surface of the transparent conductive film made of zinc oxide.

In addition, the conductive film substrate can have excellent charge mobility and low-resistance characteristics.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
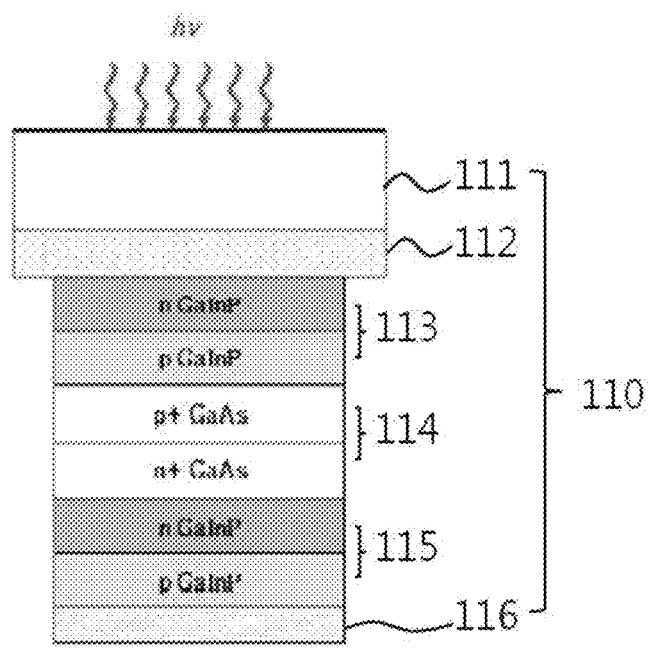
FIG. 1 is a schematic cross-sectional view showing the structure of a tandem thin-film photovoltaic cell of the related art.

Reference will now be made in detail to a conductive film substrate, a photovoltaic cell having the same, and a method of manufacturing the same according to the present invention, embodiments of which are illustrated in the accompanying drawings and described below.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

Figure 2:
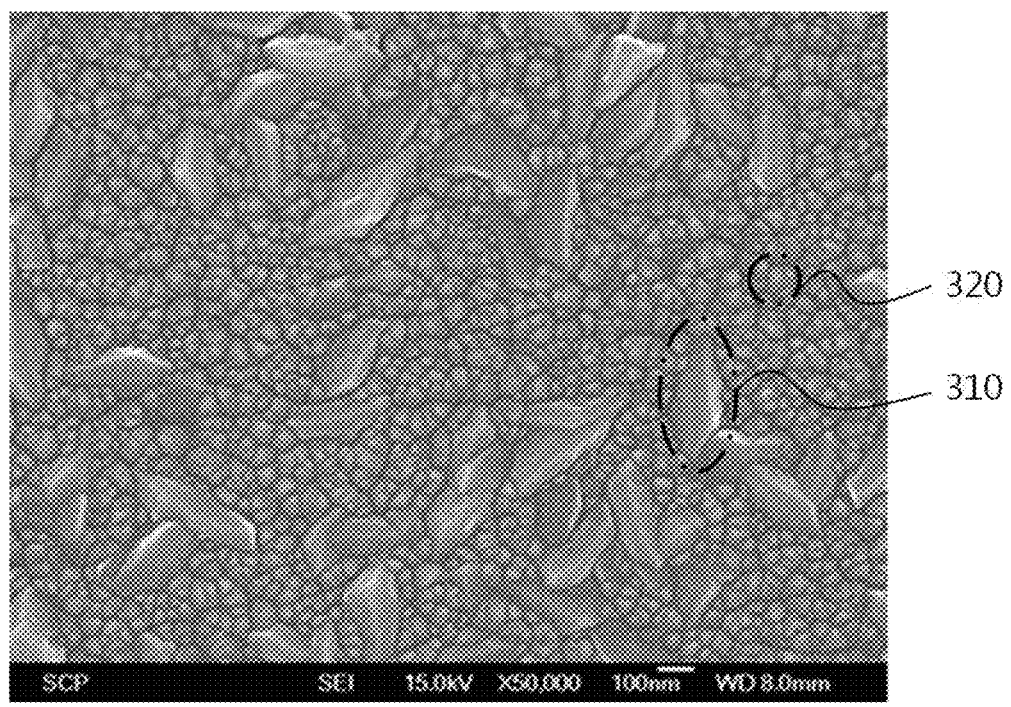
FIG. 2 is a scanning electron microscopy (SEM) picture showing a transparent conductive film according to an embodiment of the invention.
Figure 3:
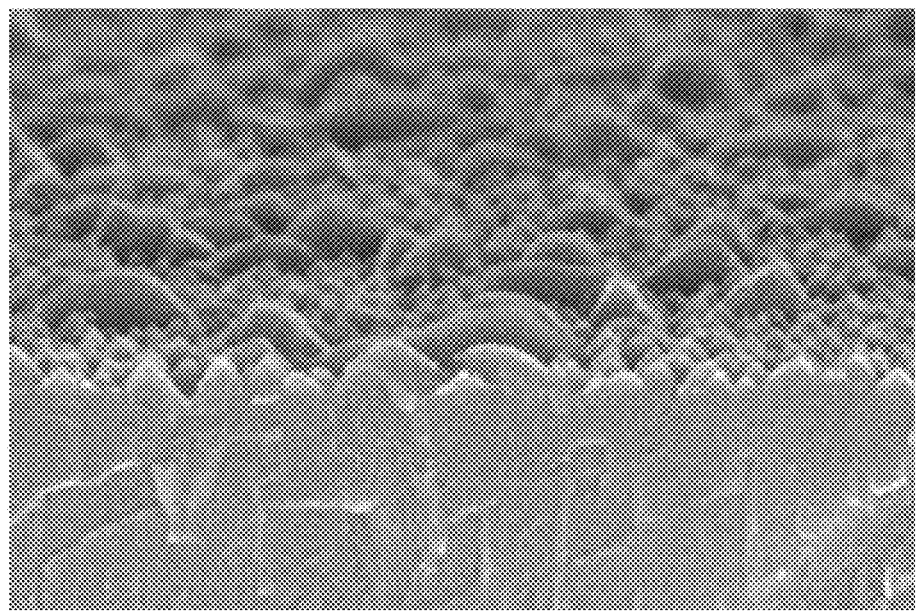
FIG. 3 is an SEM picture showing the cross-section of the transparent conductive film according to an embodiment of the invention.
Figure 4:
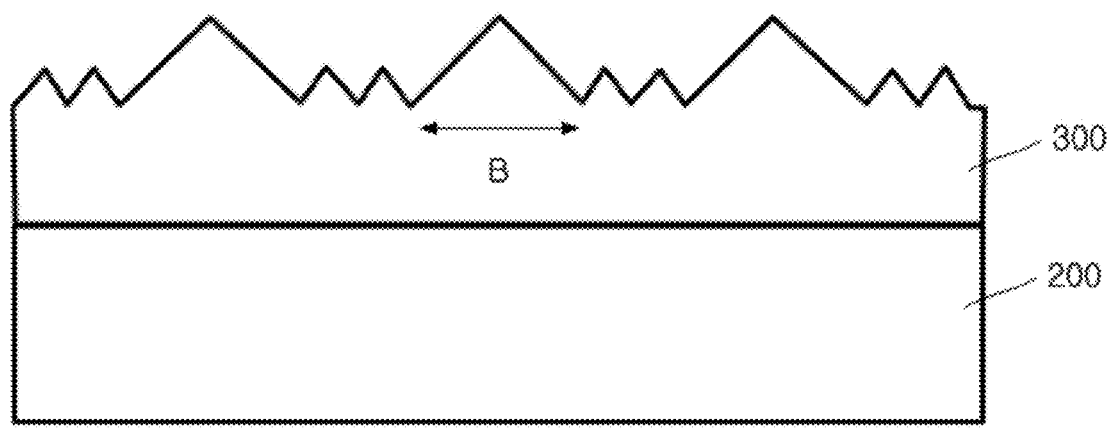
FIG. 4 is a schematic cross-sectional view showing a transparent conductive film according to an embodiment of the invention.

FIG. 2 is a scanning electron microscopy (SEM) picture showing a transparent conductive film according to an embodiment of the invention, FIG. 3 is an SEM picture showing the cross-section of the transparent conductive film according to an embodiment of the invention, and FIG. 4 is a schematic cross-sectional view showing a transparent conductive film according to an embodiment of the invention.

Referring to FIG. 2 to FIG. 4, a transparent conductive film 300 according to an embodiment of the invention is formed on a base substrate 200, and is implemented as a zinc oxide thin film which has first texture structures 310 and second texture structures 320 which are concurrently formed on the surface thereof. The first texture structures 310 are configured as islands which are positioned among the second texture structures 320.

The base substrate 200 can be implemented as a glass substrate that has an iron content of 0.02% or less, a thickness of 5 mm or less, and a light transmittance of 90% or greater.

The transparent conductive film 300 is made of zinc oxide that has excellent reduction resistance to hydrogen plasma and electrical/optical characteristics. On the surface of the transparent conductive film 300, the first texture structures 310 and the second texture structures 320 which are smaller than the first texture structures 310 are concurrently formed.

The transparent conductive film 300 can be formed by any one process selected from among, but not limited to, atmospheric pressure chemical vapor deposition (APCVD), low pressure chemical vapor deposition (LPCVD) and sputtering.

Figure 5:
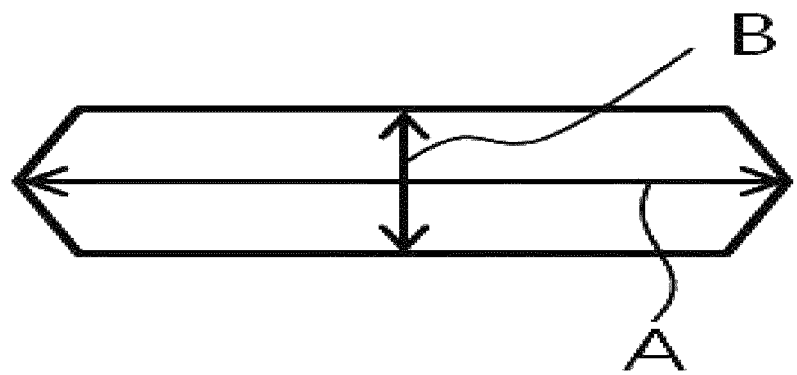
FIG. 5 is a schematic view showing a first texture structure according to an embodiment of the invention, viewed perpendicularly from above a base substrate.

The shape of the first and second texture structures 310 and 320 is substantially hexagonal when viewed perpendicularly from above the base substrate 200. In particular, as shown in FIG. 5, the shape of the first texture structures 310 is similar to an elongated hexagon.

Since the first texture structures 310 and the second texture structures 320 which are smaller than the first texture structures 310 are concurrently formed on the surface of the transparent conductive film 300 that is made of zinc oxide, the transparent conductive film 300 according to an embodiment of the invention exhibits high charge mobility and low-resistance characteristics. In addition, the transparent conductive film 300 according to an embodiment of the invention has excellent crystallinity, which reduces scattering of light that passes through the transparent conductive film, thereby realizing a high-transmittance characteristic.

In the transparent conductive film according to an embodiment of the invention, the distribution density of the first texture structures can range from $2/\mu m^2$ to $20/\mu m^2$.

In addition, the length ratio of the short axis B to the long axis A of the first texture structures can range from 0.15 to 0.70 when viewed perpendicularly from above the base substrate. It is preferred that the length of the long axis A range from 200 nm to 500 nm and the length of the short axis B range from 80 nm to 200 nm. The long axis indicates the longest length of each first texture structure when viewed perpendicularly from above the base substrate, and the short axis perpendicularly intersects the long axis.

In addition, it is preferred that the length of the axis of the second texture structures 320 range from 30 nm to 150 nm when viewed perpendicularly from above the base substrate. The distribution density of the second texture structures can range from $50/\mu m^2$ to $500/\mu m^2$ Since the first texture structures 310 and the second texture structures 320 satisfy the above-described conditions, the transparent conductive film 300 according to an embodiment of the invention can have high charge mobility of 30 $cm^2$/V·sec or greater.

In addition, the transparent conductive film 300 according to an embodiment of the invention can contain at least one sort of dopant selected from among, but not limited to, Al, Ga, B, In and F in order to reduce its sheet resistance.

It is preferred that the dopant be added in an amount of 7 wt % or less of the content of zinc oxide. Consequently, the transparent conductive film can have a sheet resistance of 15Ω/☐ or less.

Figure 6:
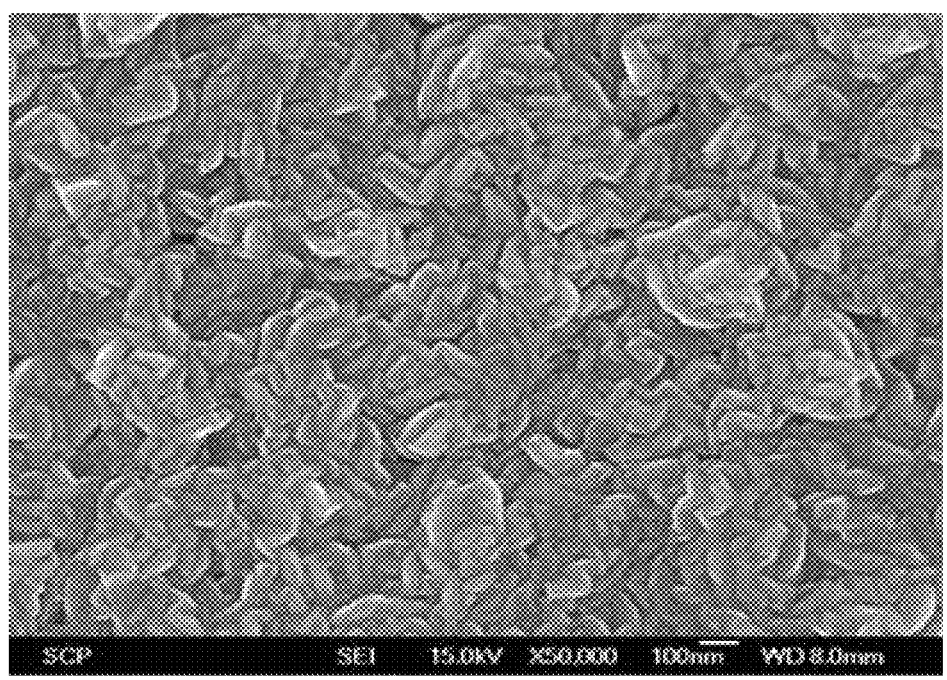
FIG. 6 is an SEM picture showing a transparent conductive film of the related art.
Figure 7:
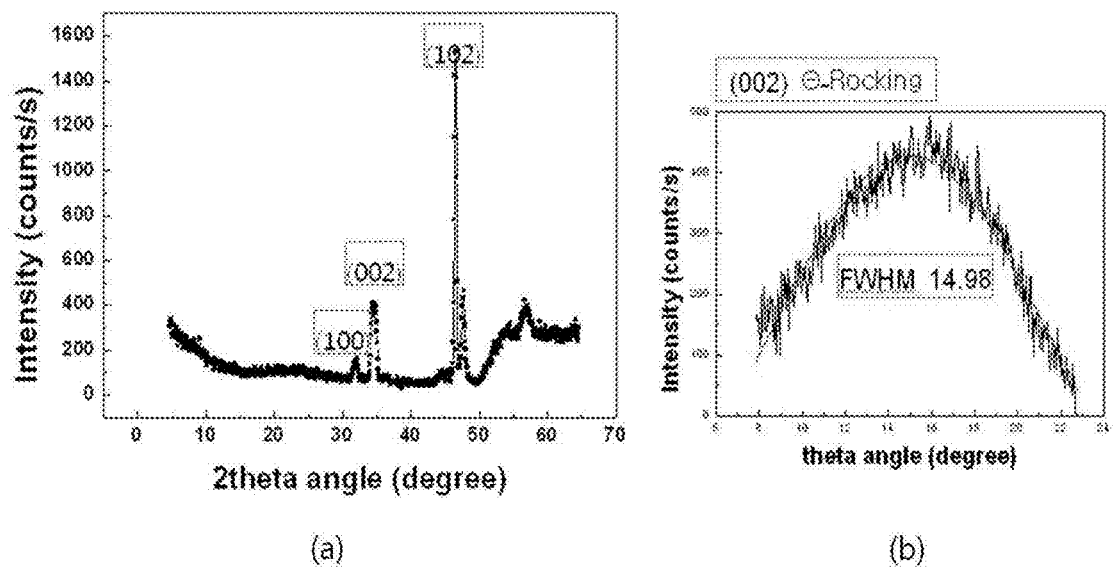
FIG. 7 is X-ray diffraction (XRD) graphs of a transparent conductive film of the related art.

FIG. 6 is an SEM picture showing a transparent conductive film of the related art, FIG. 7 (a) is a 2θ scan X-ray diffraction (XRD) graph of the film, and FIG. 7 (b) is a θ scan XRD graph in the (002) direction (θ-rocking curve) of the film.

Figure 8:
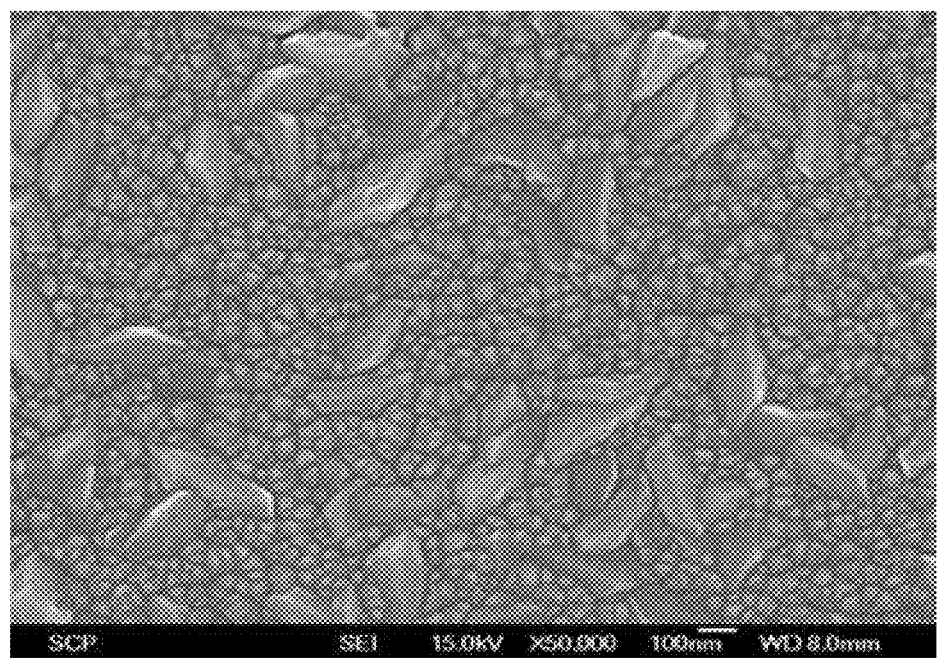
FIG. 8 is an SEM picture showing a transparent conductive film according to an embodiment of the invention.
Figure 9:
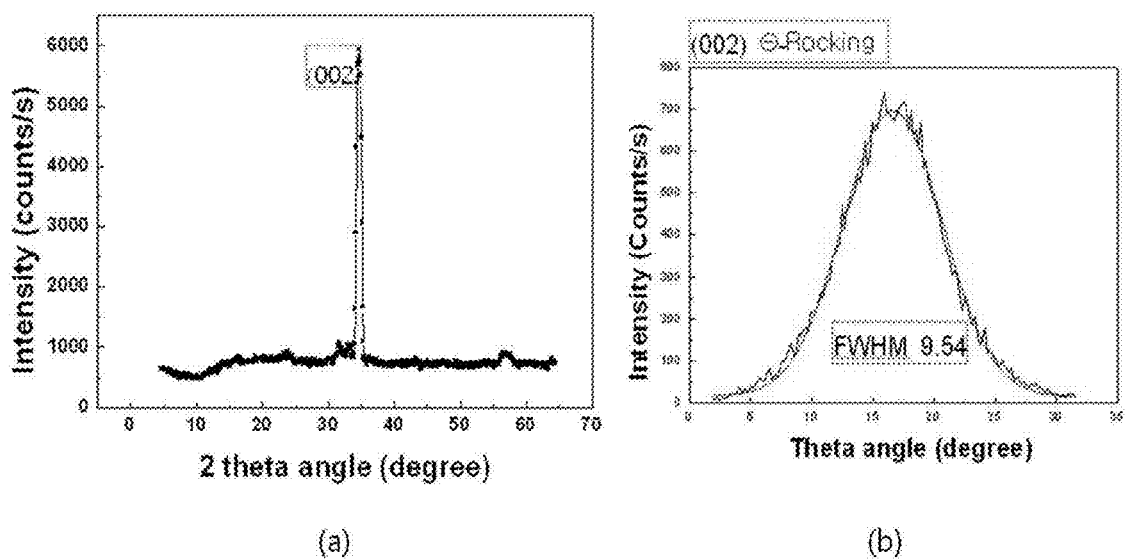
FIG. 9 is XRD graphs of a transparent conductive film according to an embodiment of the invention.
Figure 10:
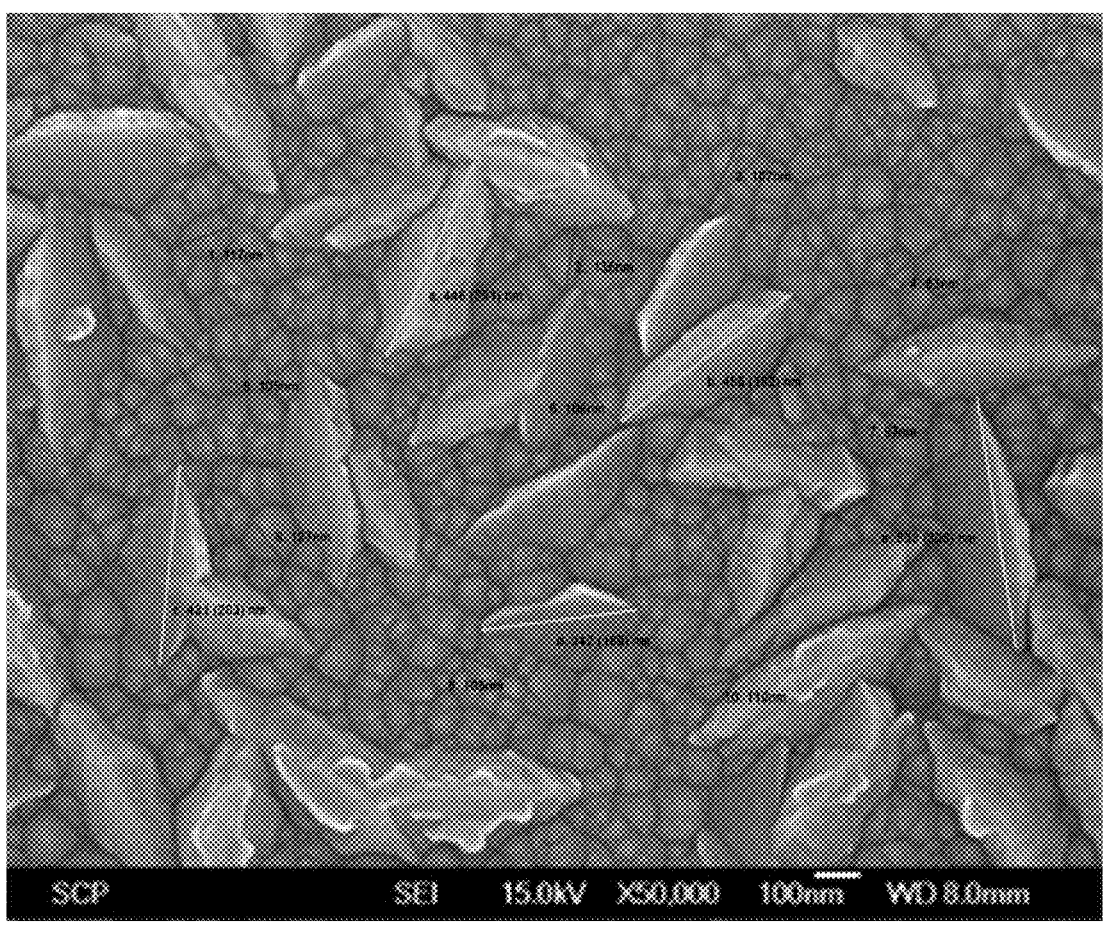
FIG. 10 to FIG. 19 are SEM pictures showing a transparent conductive film according to an embodiment of the invention.
Figure 11:
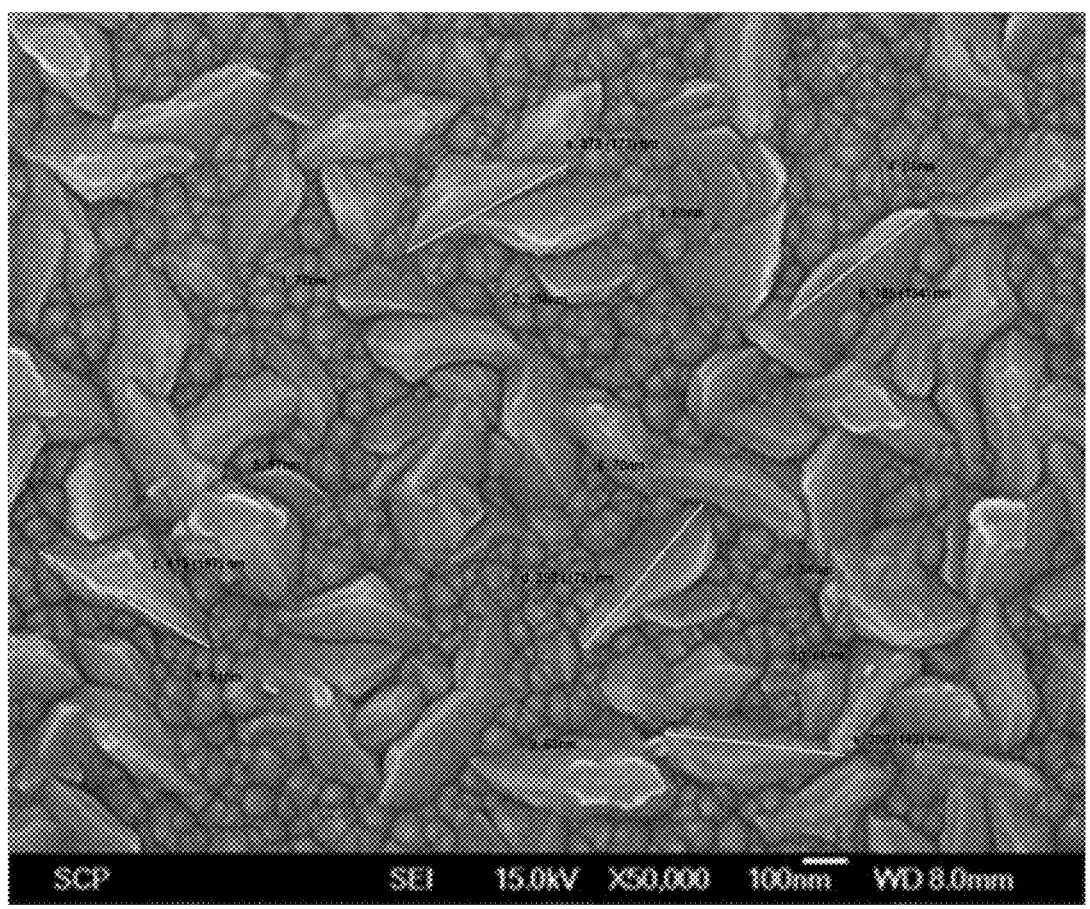
Figure 12:
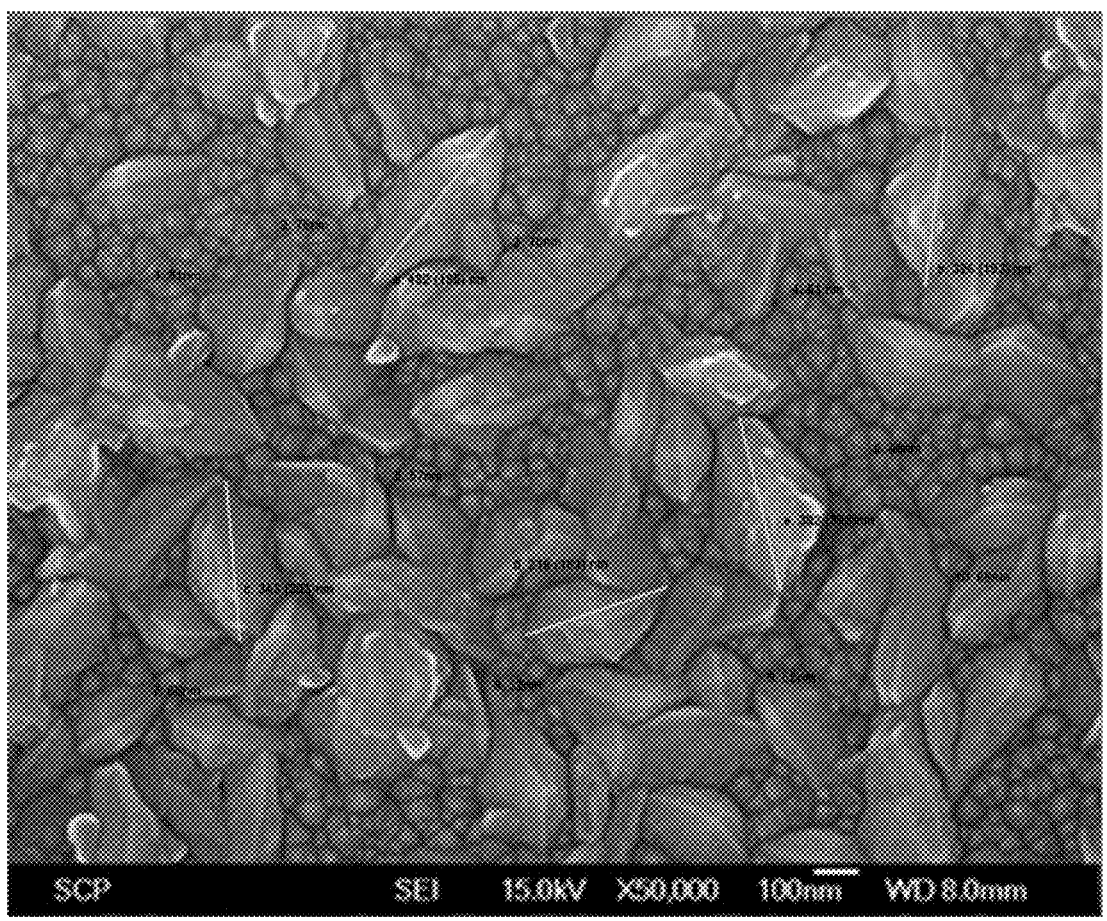
Figure 13:
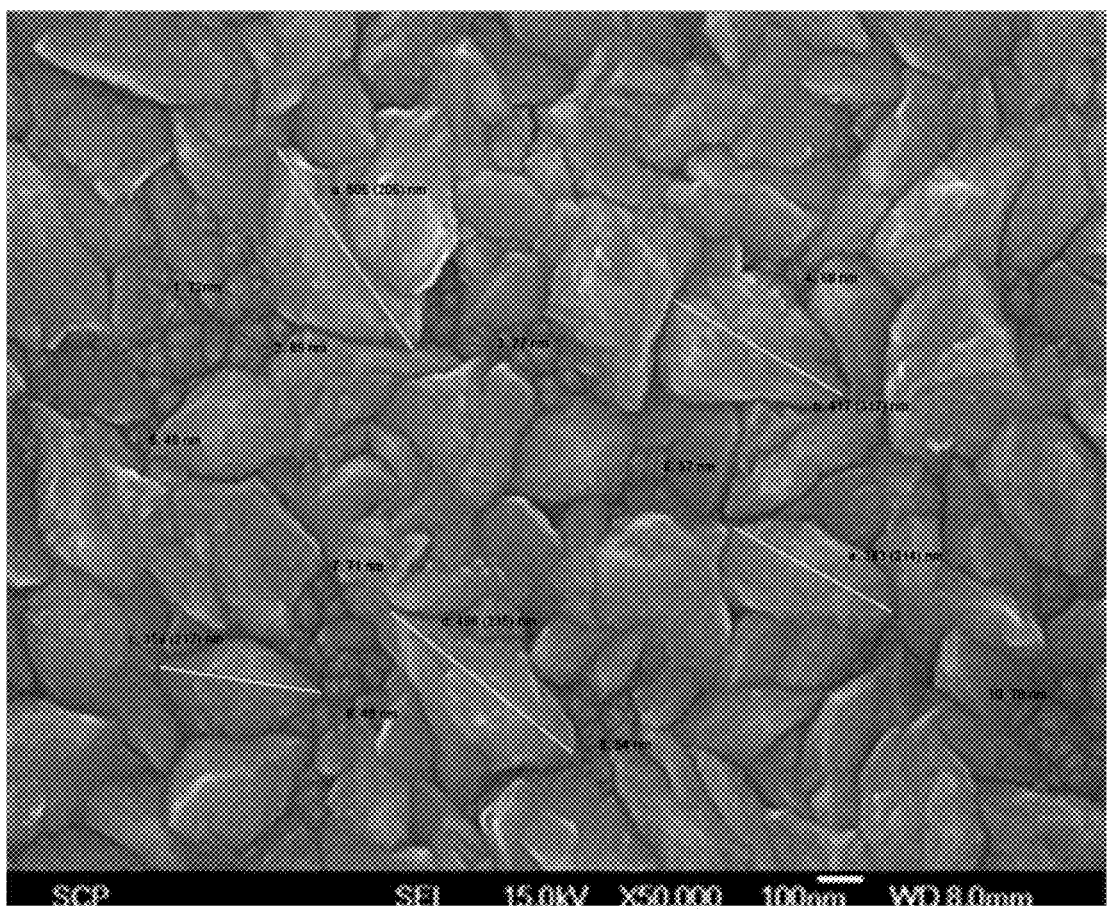
Figure 14:
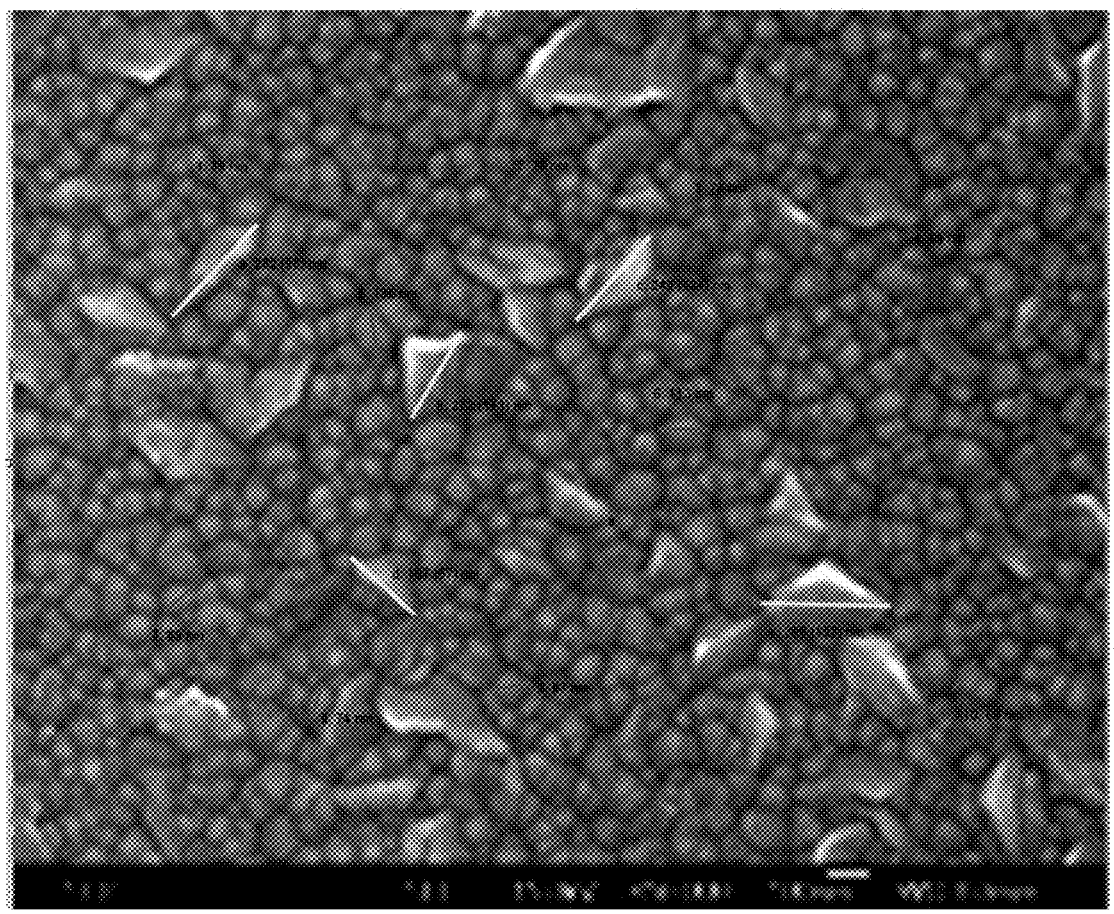
Figure 15:
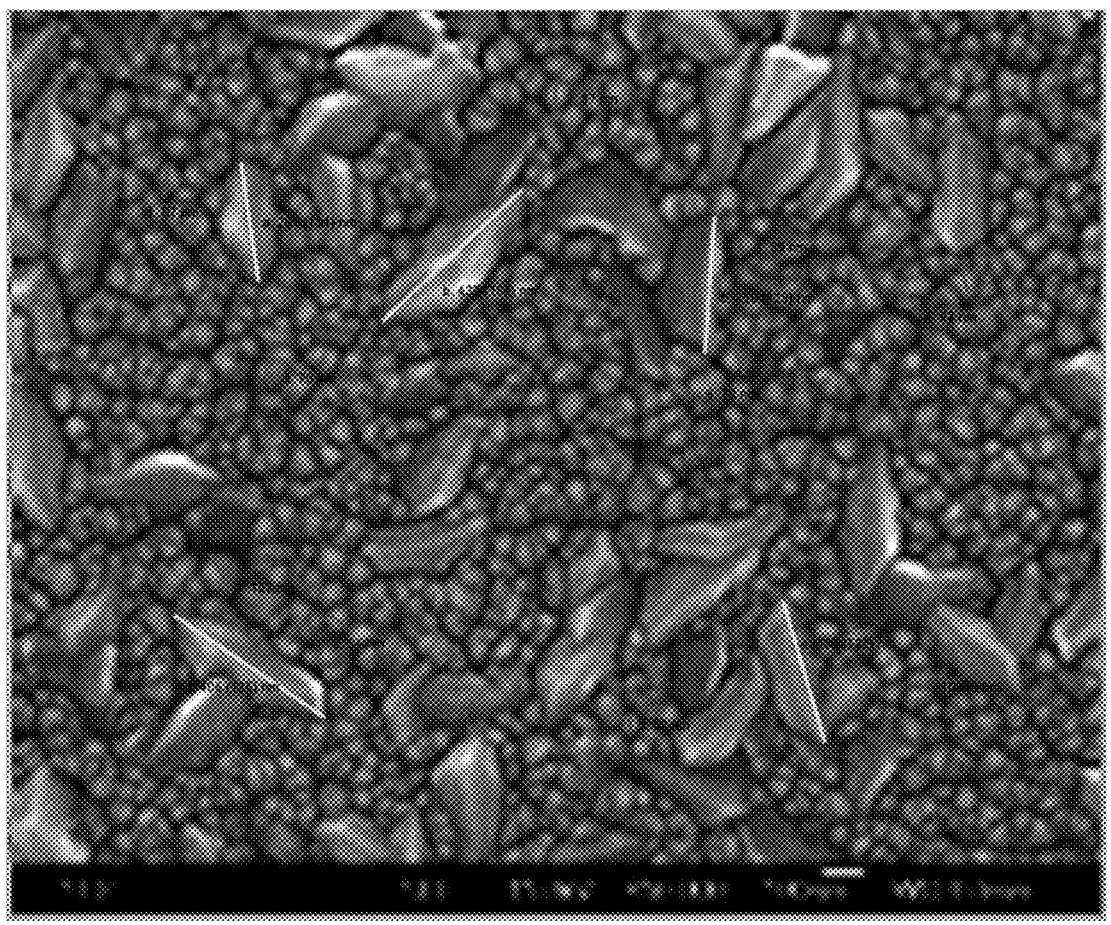
Figure 16:
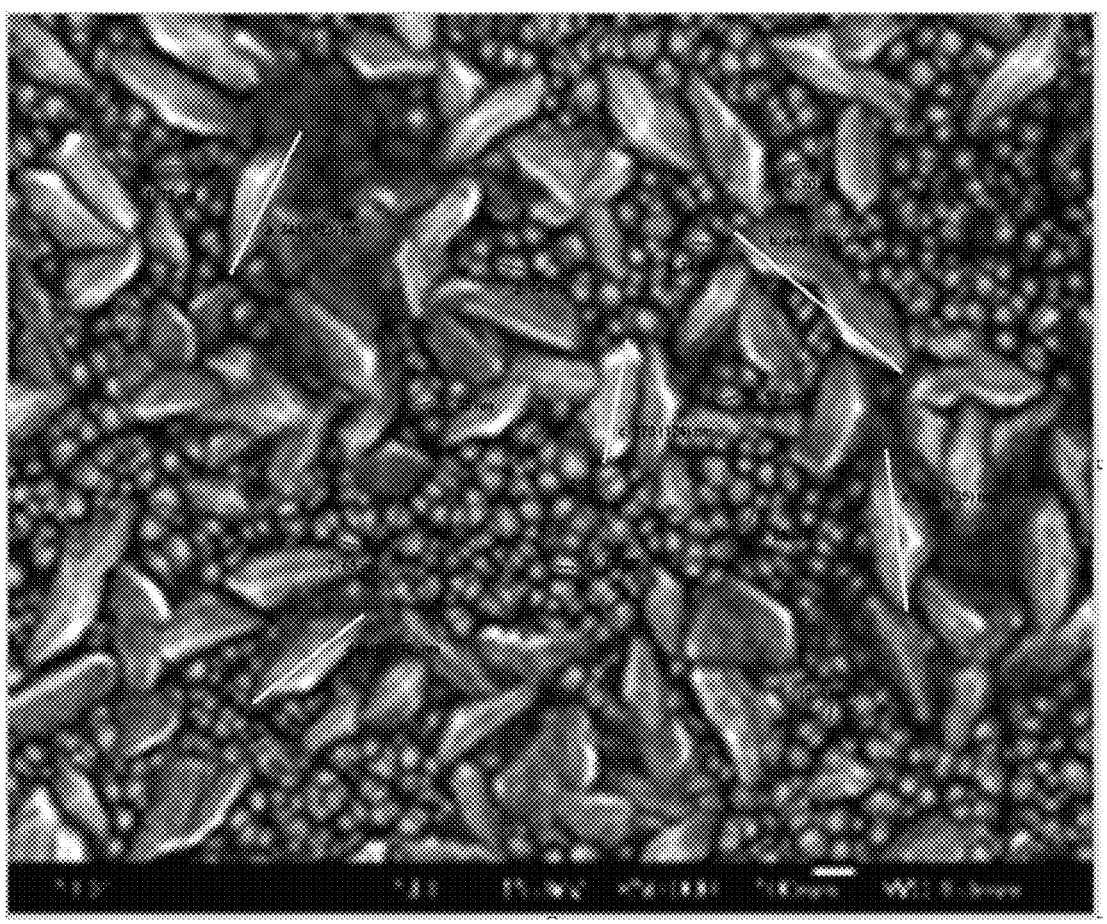
Figure 17:
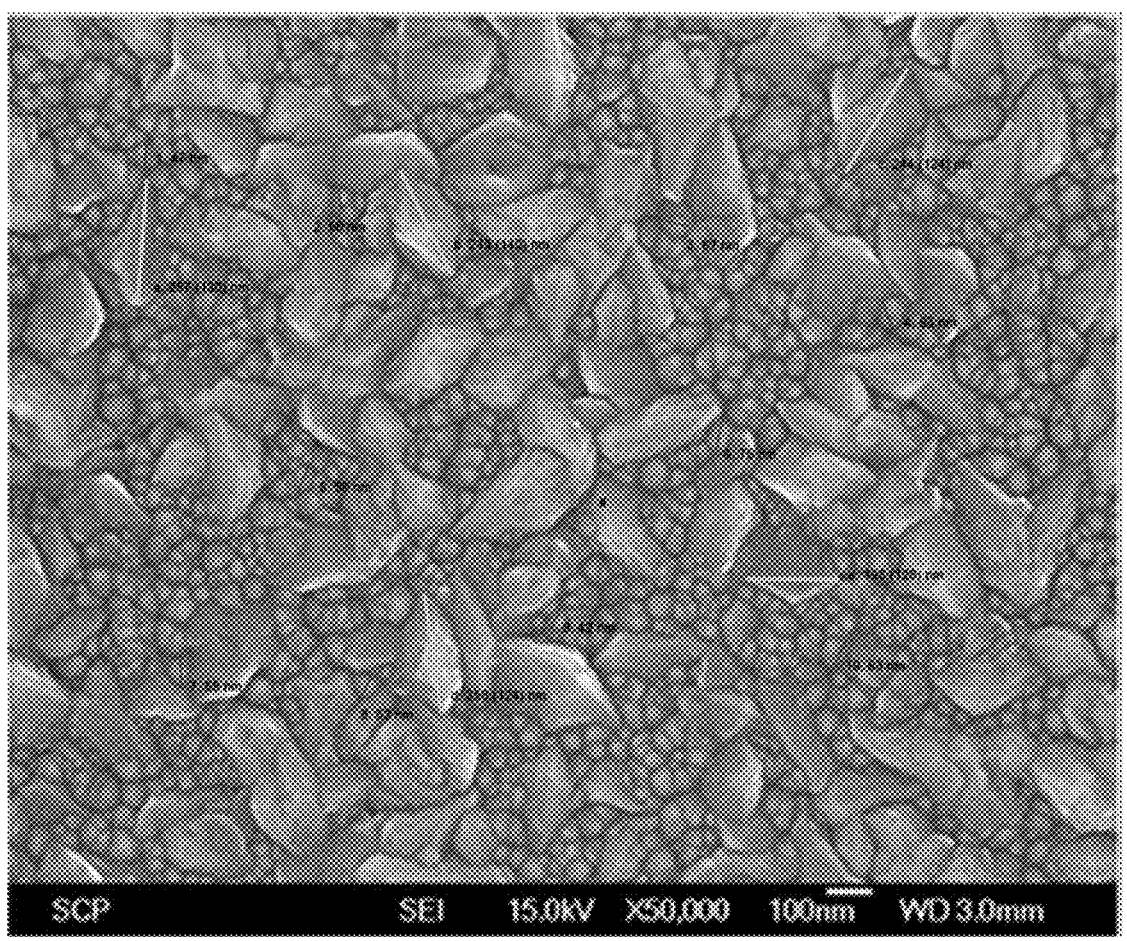
Figure 18:
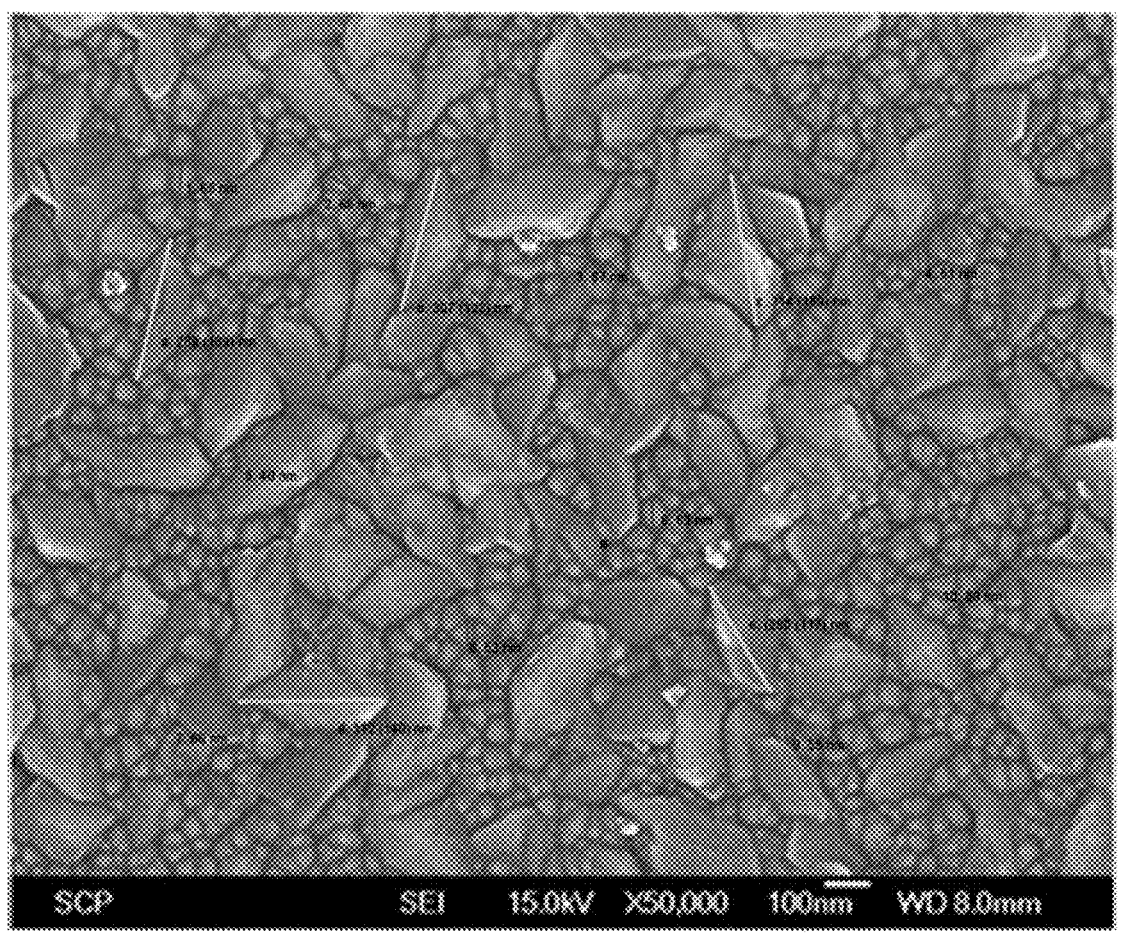
Figure 19:
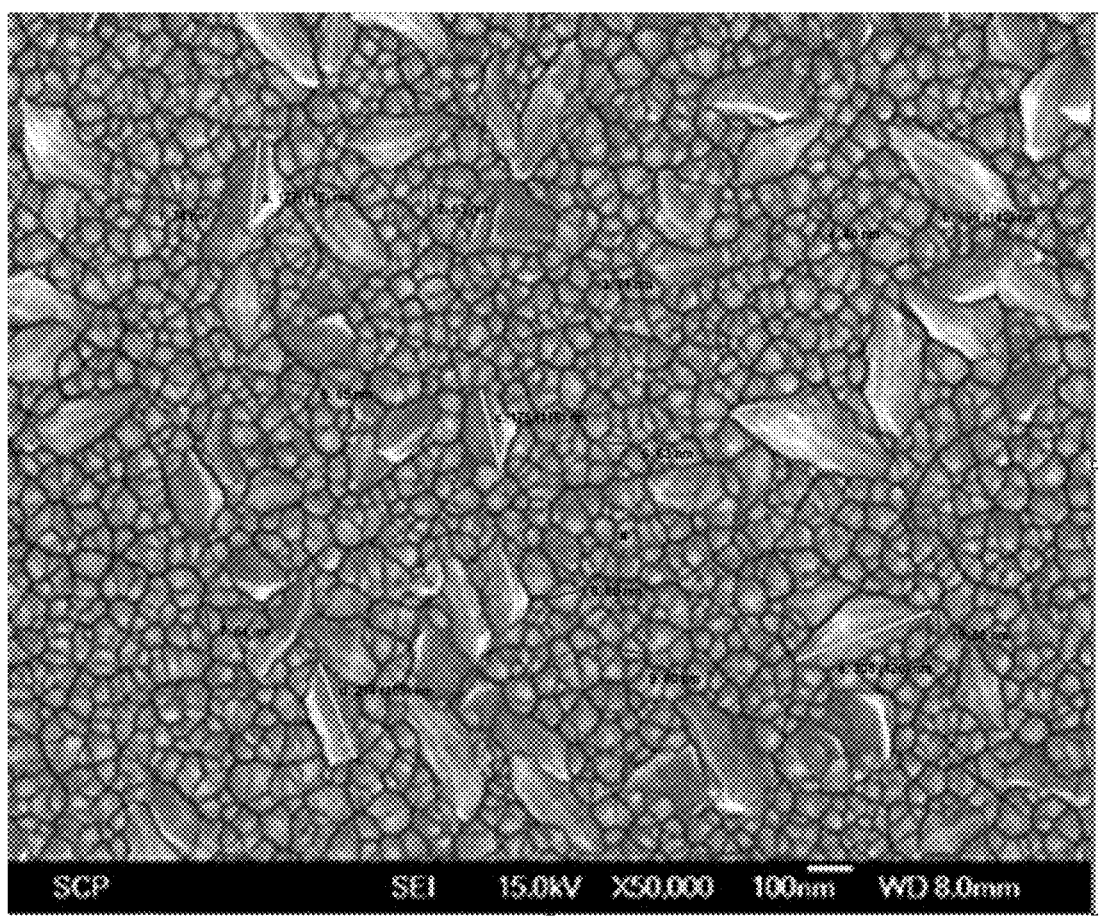

FIG. 8 is an SEM picture showing a transparent conductive film according to an embodiment of the invention, and FIG. 9 (a) is a 2θ scan X-ray diffraction (XRD) graph of the film, and FIG. 9 (b) is a θ scan XRD graph in the (002) direction (θ-rocking curve) of the film.

As shown in FIGS. 7 (a) and (b), the transparent conductive film of the related art having the above-described structure has diffraction peaks in the (100), (002) and (102) directions and a full width half maximum (FWHM) of 14.98. In contrast, as shown in FIGS. 9 (a) and (b), the transparent conductive film according to an embodiment of the invention has a diffraction peak only in the (002) direction and an FWHM of 9.54. It can be appreciated that the crystallinity in the (002) direction of the transparent conductive film according to an embodiment of the invention is significantly improved over that of the transparent conductive film of the related art.

In addition, the carrier density and charge mobility of the transparent conductive films shown in FIG. 6 and FIG. 8 are presented in Table 1 below.

TABLE 1

|  | Carrier density (carriers/$cm^3$) | Charge mobility ($cm^2$/V · sec) |
|---|---|---|
| Transparent conductive film shown in FIG. 6 | $2.77 \times 10^{20}$ | 16.29 |
| Transparent conductive film shown in FIG. 8 | $3.65 \times 10^{20}$ | 43.72 |

As shown in Table 1 above, it can be appreciated that the transparent conductive film according to the invention has better charge mobility than the transparent conductive film of the related art.

Table 2 below presents the charge mobility of transparent conductive films according to embodiments of the invention shown in FIG. 10 to FIG. 19.

Here, Sample No. 1 to Sample No. 10 respectively indicate the transparent conductive films shown in FIG. 10 to FIG. 19. In cells for first texture structures, a, b, c, d and e indicate first texture structures that were measured, x indicates the length of the long axis, and y indicates the length of the short axis. In addition, in cells for second texture structures, 1 to 10 indicate the length of the axis when second texture structures that were measured are viewed perpendicularly from above.

TABLE 2

|  |  | Sample No. | | | | | | | | | |
|---|---|---|---|---|---|---|---|---|---|---|---|
|  |  | 1 | 2 | 3 | 4 | 5 | 6 | 7 | 8 | 9 | 10 |
| Charge mobility ($cm^2$/V · sec) |  | 27.6 | 30.9 | 22.4 | 19.4 | 17.9 | 43.1 | 32.2 | 20.5 | 32.1 | 24.8 |
| $1^{st}$ texture structure | a-x | 446 | 372 | 422 | 506 | 282 | 261 | 341 | 257 | 288 | 177 |
|  | a-y | 251 | 173 | 195 | 206 | 90 | 134 | 123 | 130 | 109 | 118 |
|  | b-x | 456 | 385 | 326 | 417 | 222 | 433 | 484 | 243 | 307 | 196 |
|  | b-y | 182 | 134 | 193 | 317 | 141 | 164 | 130 | 140 | 122 | 142 |
|  | c-x | 421 | 415 | 343 | 359 | 249 | 290 | 270 | 244 | 314 | 175 |
|  | c-y | 203 | 197 | 203 | 217 | 124 | 129 | 124 | 124 | 180 | 118 |
|  | d-x | 342 | 392 | 316 | 496 | 187 | 406 | 315 | 250 | 312 | 214 |
|  | d-y | 188 | 175 | 183 | 235 | 67 | 136 | 110 | 124 | 140 | 105 |
|  | e-x | 538 | 388 | 382 | 383 | 289 | 330 | 352 | 195 | 250 | 308 |
|  | e-y | 205 | 143 | 272 | 214 | 152 | 122 | 135 | 120 | 117 | 120 |
| $2^{nd}$ texture structure | 1 | 117 | 77 | 81 | 72 | 75 | 87 | 72 | 47 | 68 | 74 |
|  | 2 | 135 | 104 | 78 | 89 | 76 | 57 | 74 | 50 | 65 | 63 |
|  | 3 | 107 | 69 | 70 | 77 | 74 | 59 | 74 | 67 | 67 | 71 |
|  | 4 | 53 | 86 | 61 | 68 | 65 | 67 | 70 | 63 | 51 | 40 |
|  | 5 | 105 | 97 | 57 | 49 | 136 | 70 | 65 | 75 | 40 | 85 |
|  | 6 | 106 | 70 | 60 | 57 | 113 | 78 | 65 | 58 | 69 | 63 |

TABLE 2-continued

| | Sample No. | | | | | | | | | |
|---|---|---|---|---|---|---|---|---|---|---|
| | 1 | 2 | 3 | 4 | 5 | 6 | 7 | 8 | 9 | 10 |
| 7 | 97 | 66 | 68 | 71 | 85 | 107 | 65 | 65 | 66 | 64 |
| 8 | 127 | 51 | 52 | 49 | 74 | 54 | 72 | 63 | 53 | 80 |
| 9 | 105 | 63 | 65 | 54 | 87 | 52 | 55 | 42 | 55 | 60 |
| 10 | 110 | 66 | 69 | 78 | 69 | 75 | 61 | 63 | 80 | 55 |

As presented in Table 2 above, it can be appreciated that the transparent conductive film according to the invention has better charge mobility than the transparent conductive film of the related art. In particular, as presented in Sample Nos. 2, 6, 7 and 9, it is apparent that the transparent conductive film has high charge mobility of 30 $cm^2/V \cdot sec$ or greater when the following conditions are satisfied, i.e., the length of the long axis of the first texture structures ranges from 200 nm to 500 nm, the length of the short axis of the first texture structures ranges from 80 nm to 200 nm, and the length of the axis of the second texture structures ranges from 30 nm to 150 nm.

When a photovoltaic cell is manufactured using the above-described transparent conductive film, it is possible to improve the power generation efficiency of the cell by increasing the short-circuit current density (Jsc) of the cell based on high charge mobility and high-transmittance characteristic.

A description will be given below of a method of manufacturing a transparent conductive film according to an embodiment of the invention.

The transparent conductive film according to an embodiment of the invention is manufactured by forming a transparent conductive film made of zinc oxide which has first texture structures and second texture structures concurrently formed on the surface thereof, the second texture structures being smaller than the first texture structures, on a base substrate by any one process selected from among, but not limited to, atmospheric pressure chemical vapor deposition (APCVD), low pressure chemical vapor deposition (LPCVD) and sputtering. When the transparent conductive film is formed by APCVD or LPCVD, an etching process for forming the texture structures is not required, thereby improving productivity. In particular, APCVD has advantages of a fast coating rate and high productivity, which are suitable for mass production of transparent conductive films.

In order to manufacture the transparent conductive film by APCVD, first, the base substrate is loaded into a chamber.

Afterwards, the substrate that has been loaded into the chamber is heated. Heating can be continuously carried out from the step at which the substrate is loaded into the chamber. It is preferred that the temperature of the heated substrate range from 350° C. to 550° C.

Finally, a zinc precursor and an oxidizer gas are fed into the chamber in which the substrate is loaded, thereby manufacturing a transparent conductive film according to the invention. Here, it is preferred that the zinc precursor and the oxidizer gas be fed along different paths in order to prevent the zinc precursor and the oxidizer gas from mixing before entering the chamber. The zinc precursor and the oxidizer gas can be preheated before being fed into the chamber in order to promote a chemical reaction.

The zinc precursor and the oxidizer gas can be fed such that the mole ratio between the zinc precursor and the oxidizer gas, i.e. the mole ratio of the zinc precursor to the oxidizer gas, ranges from 12 to 48.

In addition, the zinc precursor can be fed in a rate ranging from 0.001552 mol/min to 0.002328 mol/min into the chamber, and the oxidizer gas can be fed in a rate ranging from 0.5 g/min to 1 g/min into the chamber.

The zinc precursor can be fed on a carrier gas that is made of nitrogen.

The zinc precursor can be implemented as any one selected from among, but not limited to, diethylzinc (DEZ), dimethylzinc (DMZ) and a mixture thereof. DEZ or DMZ is preferable considering the resistance and transmittance of the transparent conductive film. In addition, the oxidizer gas can be implemented as at least one substance selected from among, but not limited to, $H_2O$, ethanol, methanol, butanol, propanol and isopropyl alcohol.

In the step of feeding the zinc precursor and the oxidizer gas, at least one sort of dopant selected from among, but not limited to, Al, Ga, B, In and F can be added. It is preferred that the dopant be added in an amount of 7 wt % or less of the content of zinc oxide.

The foregoing descriptions of specific exemplary embodiments of the present invention have been presented with respect to the certain embodiments and drawings. They are not intended to be exhaustive or to limit the invention to the precise forms disclosed, and obviously many modifications and variations are possible for a person having ordinary skill in the art in light of the above teachings.

It is intended therefore that the scope of the invention not be limited to the foregoing embodiments, but be defined by the Claims appended hereto and their equivalents.

What is claimed is:

1. A method of manufacturing a conductive film substrate comprising:
    preparing the base substrate; and
    forming the transparent conductive film on the base substrate,
    wherein the transparent conductive film is a zinc oxide thin film which has first texture structures and second texture structures, the second texture structures being smaller than the first texture structures,
    wherein forming the transparent conductive film comprises concurrently forming the first texture structures and the second texture structures on a surface of the zinc oxide thin film,
    wherein the transparent conductive film is formed by atmospheric pressure chemical vapor deposition,
    wherein the atmospheric pressure chemical vapor deposition comprises:
        loading the base substrate into a chamber;
        heating the loaded base substrate; and
        feeding a zinc precursor and an oxidizer gas into the chamber, a molar ratio of the zinc precursor to the oxidizer gas ranging from 1:12 to 1:28,
    wherein a distribution density of the first texture structures ranges from $2/\mu m^2$ to $20/\mu m^2$ and a distribution density of the second texture structures ranges from $50/\mu m^2$ to $500/\mu m^2$.

2. The method of claim 1, wherein feeding the zinc precursor and the oxidizer gas comprises feeding the zinc precursor at a rate ranging from 0.001552 mol/min to 0.002328 mol/min and the oxidizer gas at a rate ranging from 0.5 g/min to 1 g/min.

3. The method of claim 1, wherein the zinc precursor comprises one selected from the group consisting of diethylzinc, dimethylzinc and a mixture thereof.

4. The method of claim 1, wherein the oxidizer gas comprises at least one substance selected from the group consisting of $H_2O$, ethanol, methanol, butanol, propanol and isopropanol.

5. The method of claim 1, wherein heating the loaded base substrate comprises heating the loaded base substrate in a temperature ranging from 350° C. to 550° C.

6. The method of claim 1, wherein feeding the zinc precursor and the oxidizer gas comprises additionally feeding at least one sort of dopant selected from the group consisting of Al, Ga, B, In and F.

7. The method of claim 6, wherein the dopant is added in an amount of 7 wt % or less of a content of zinc oxide.

8. The method of claim 1, wherein the first texture structures have a length ratio of a short axis to a long axis ranging from 0.15 to 0.70 when viewed perpendicularly from above the base substrate.

9. The method of claim 1, wherein a length of each long axis of the first texture structures ranges from 200 nm to 500 nm and a length of each short axis of the first texture structures ranges from 80 nm to 200 nm when viewed perpendicularly from above the base substrate.

10. The method of claim 1, wherein the first texture structures have a hexagonal shape when viewed perpendicularly from above the base substrate.

11. The method of claim 1, wherein a length of each axis of the second texture structures ranges from 30 nm to 150nm when viewed perpendicularly from above the base substrate.

* * * * *